(12) United States Patent
Ikeda

(10) Patent No.: US 7,396,715 B2
(45) Date of Patent: Jul. 8, 2008

(54) SEMICONDUCTOR DEVICE AND MANUFACTURING METHOD OF THE SAME

(75) Inventor: Kazuto Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 363 days.

(21) Appl. No.: 11/189,816

(22) Filed: Jul. 27, 2005

(65) Prior Publication Data

US 2006/0220143 A1    Oct. 5, 2006

(30) Foreign Application Priority Data

Mar. 29, 2005    (JP) ............................. 2005-096089

(51) Int. Cl.
*H01L 21/45* (2006.01)
*H01L 29/45* (2006.01)

(52) U.S. Cl. .................. 438/207; 438/218; 438/219; 257/375

(58) Field of Classification Search ............. 438/207, 438/218, 219; 257/374
See application file for complete search history.

(56) References Cited

U.S. PATENT DOCUMENTS 5,254,489 A * 10/1993 Nakata .................. 438/258
6,184,083 B1 * 2/2001 Tsunashima et al. ........ 438/257
6,538,278 B1 * 3/2003 Chau ......................... 257/324
6,597,046 B1 * 7/2003 Chau et al. ................. 257/411

FOREIGN PATENT DOCUMENTS

JP    2000-188338    7/2000

OTHER PUBLICATIONS

Patent Abstracts of Japan, Publication No. 2000188338, filed on Jul. 4, 2000.
Patent Abstracts of Japan, Publication No. 2003023100, filed Jan. 24, 2003.

* cited by examiner

*Primary Examiner*—Thao X. Le
*Assistant Examiner*—Ajay K Arora
(74) *Attorney, Agent, or Firm*—Westerman, Hattori, Daniels & Adrian, LLP.

(57) ABSTRACT

Patterning is performed in such a manner that an end portion fabricated of a second gate insulating film partially overlaps an end portion fabricated of a first gate insulating film. Then, a surface recovery treatment is performed in the aforementioned state where the first and second gate insulating films partially overlap each other.

14 Claims, 6 Drawing Sheets

SEMICONDUCTOR DEVICE AND MANUFACTURING METHOD OF THE SAME

CROSS-REFERENCE TO RELATED APPLICATIONS

This application is based upon and claims the benefit of priority from the prior Japanese Patent Application No. 2005-096089, filed on Mar. 29, 2005, the entire contents of which are incorporated herein by reference.

BACKGROUND OF THE INVENTION

1. Field of the Invention

The present invention relates to a semiconductor device including two types of MIS transistors and a manufacturing method of the same, and particularly is suitable for application to a semiconductor device using a high dielectric constant material for a gate insulating film of one of the MIS transistors.

2. Description of the Related Art

In recent years, as a transistor whose gate leakage current is small and power consumption is low, a MIS transistor using a gate insulating film made of a high dielectric constant material (hereinafter abbreviated only as a high dielectric constant transistor) attracts attention. However, this high dielectric constant transistor is not suitable for high-speed operation at a low threshold voltage since the threshold voltage shifts to the high-voltage side.

On the other hand, a MIS transistor using a gate insulating film made of a silicon oxide or a silicon oxynitride (hereinafter abbreviated only as a SiO-based transistor) enables high-speed operation since the threshold voltage can be made low although its power consumption is higher than that of the high dielectric constant transistor.

Hence, it is proposed that as a semiconductor device, the high dielectric constant transistor and the SiO-based transistor are mixedly mounted, and the former transistor is mounted on a portion which does not require high-speed operation but requires low power consumption, whereas the latter transistor is mounted on a portion which requires high-speed operation although its power consumption is relatively high. More specifically, as in Patent Documents 1 and 2, after a first gate insulating film made of a silicon oxide is first formed on the entire surface of a substrate, the first insulating film is patterned to be left only on a first active region. Then, after a second gate insulating film made of a high-melting point material is formed on the entire surface of the substrate, including the first gate insulating film, the second gate insulating film is patterned to be left only on a second active region. By this series of process steps, the first gate insulating film and the second gate insulating film can be separately formed on the first active region and the second active region, respectively.

(Patent Document 1)
Japanese Patent Application Laid-open No. 2000-188338
(Patent Document 2)
Japanese Patent Application Laid-open No. 2003-23100

However, in the case of Patent Documents 1 and 2, when the second gate insulating film is patterned, surface damage due to etching is inevitably caused to the first gate insulating film when the second gate insulating film on the first gate insulating film is removed by etching. If the transistors are formed in this state, satisfactory electric properties of the transistors (for example, reduction in gate leakage current, operating life extension, and so on) cannot be obtained.

SUMMARY OF THE INVENTION

The present invention is made in view of the aforementioned problem and its object is to provide a semiconductor device capable of obtaining satisfactory electric properties of transistors (for example, reduction in gate leakage current, operating life extension, and so on) by recovering surface damage due to etching and higher integration of the device by increasing design flexibility when a first gate insulating film and a second gate insulating film are separately formed on a first active region and a second active region, respectively, and a manufacturing method of the same.

A manufacturing method of a semiconductor device of the present invention comprises the steps of: subjecting a surface of a semiconductor substrate to element isolation to demarcate a first active region and a second active region; forming a first gate insulating film on the first active region and the second active region; fabricating the first gate insulating film and leaving the first gate insulating film in such a manner that an end portion fabricated of the first gate insulating film is located on any portion other than a first gate electrode forming region in the first active region and a second gate electrode forming region in the second active region; forming a second gate insulating film on the first active region and the second active region, including on the first gate insulating film; fabricating the second gate insulating film and leaving the second gate insulating film in such a manner that an end portion fabricated of the second gate insulating film overlaps the end portion fabricated of the first gate insulating film; simultaneously subjecting a surface of the first gate insulating film and a surface of the second gate insulating film to a surface recovery treatment; and pattern-forming a first gate electrode on the first gate electrode forming region with the first gate insulating film therebetween and a second gate electrode on the second gate electrode forming region with the second gate insulating film therebetween, respectively.

A semiconductor device of the present invention is a semiconductor device including at least two types of transistors on a semiconductor substrate, wherein one of the transistors comprises: a first gate insulating film which is made of a silicon oxide or a silicon oxynitride and whose surface layer is brought into a nitrided state with a higher nitrogen content or an oxynitrided state with a higher oxygen and nitrogen content than portions other than the surface layer; and a first gate electrode which is pattern-formed with the first gate insulating film in between, and the other of the transistors comprises: a second gate insulating film which is made of a high dielectric constant film and whose surface layer is brought into the nitrided state or the oxynitrided state; and a second gate electrode which is pattern-formed with the second gate insulating film in between.

DETAILED DESCRIPTION OF THE PREFERRED EMBODIMENTS

Basic Gist of the Present Invention

When separately forming a first gate insulating film and a second gate insulating film on a first active region and a second active region, respectively, the present inventor removes the second gate insulating film on the first gate insulating film by etching and thereafter subjects the entire surfaces of the first and second gate insulating films to a nitriding treatment or an oxynitriding treatment to recover surface damage caused to the first gate insulating film especially due to etching of the second gate insulating film. As just described, in the present invention, in the state where the first and second gate insulating films are separately formed, both the gate insulating films are simultaneously subjected to a surface recovery treatment, for example, the nitriding treatment or the oxynitriding treatment. By this surface recovery treatment, surface layers of the first and second gate insulating films are brought into a nitrided state in the case of the nitriding treatment or brought into an oxynitrided state in the case of the oxynitriding treatment, and thereby the surface damage is recovered. The (oxy)nitrided state here means a state in which (oxygen and) nitrogen are mixed into the surface layers of the first and second gate insulating films and thereby the (oxygen and) nitrogen content is higher than that of portions other than these surface layers. As just described, in the present invention, it is possible to improve an electric property not only of the first gate insulating film but also of the second gate insulating film which is vulnerable to a little surface damage in its forming step by simultaneously subjecting the first and second gate insulating films to the surface recovery treatment without unnecessarily causing an increase in step.

Figure 1A:
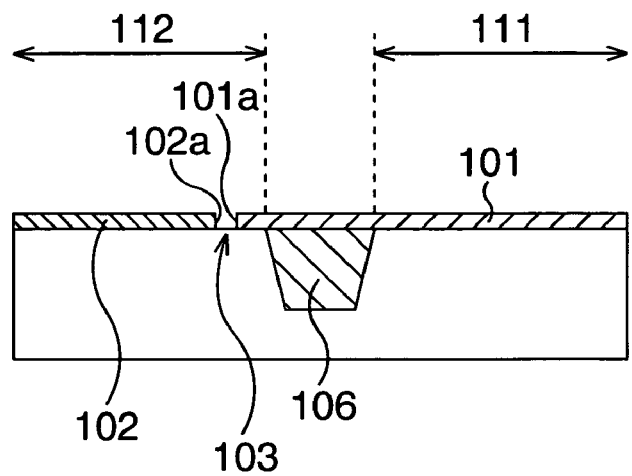
FIG. 1A to FIG. 1D are schematic sectional views for explaining a basic gist of the present invention.
Figure 1B:
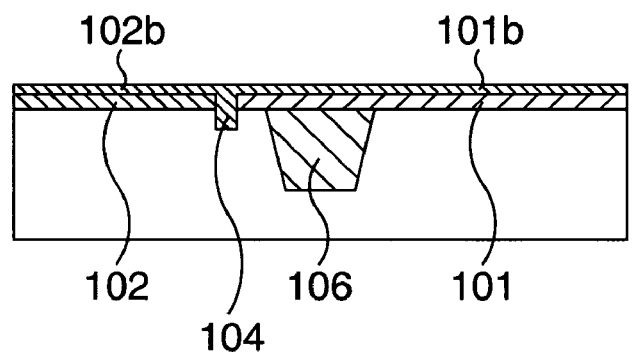
Figure 1C:
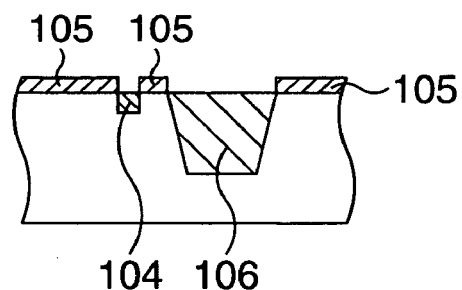
Figure 1D:
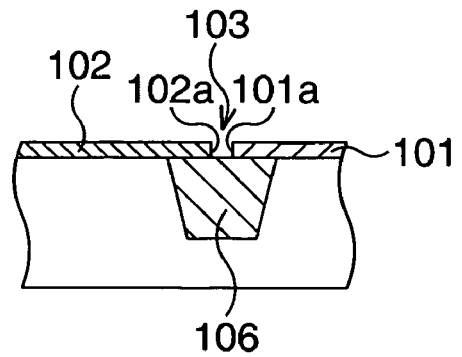

Further, the present inventor has assiduously studied the influence of the surface recovery treatment on a semiconductor device on the precondition that the surface recovery treatment is performed. For example, as shown in FIG. 1A to FIG. 1D, an end portion fabricated 101a by etching of a first gate insulating film 101 formed on a first active region 111 and an end portion fabricated 102a by etching of a second gate insulating film 102 formed on a second active region 112 are slightly apart from each other to form a gap 103, and, for example, a case where the gap 103 is located on one of the active regions (on the second active region 112 in the example shown) (FIG. 1A) is considered. If the surface recovery treatment is performed in this state, surface layers 101b and 102b of the first and second gate insulating films 101 and 102 are brought into the nitrided state or the oxynitrided state, and a portion of the second active region 112 exposed from the gap 103 is also nitrided or oxynitrided to form a degenerated portion 10A (FIG. 1B). When a manufacturing process is advanced in this state and a silicide layer 105 is formed, for example, on the second active region 112 or the like, defective formation of the silicide layer 105 occurs on the deformed portion 104 (FIG. 1C).

On the other hand, if the gap 103 is formed on an element isolation structure 106 made of an insulator (FIG. 1D), there may be no bad influence exerted on the device even if the degenerated portion 104 is formed. However, in this case, it is necessary to pattern the first gate insulating film in such a manner that the gap 103 is located on the element isolation structure 106 which is always relatively narrow, and therefore it is obliged to accept the large constraint that design flexibility is extremely reduced.

Figure 2A:
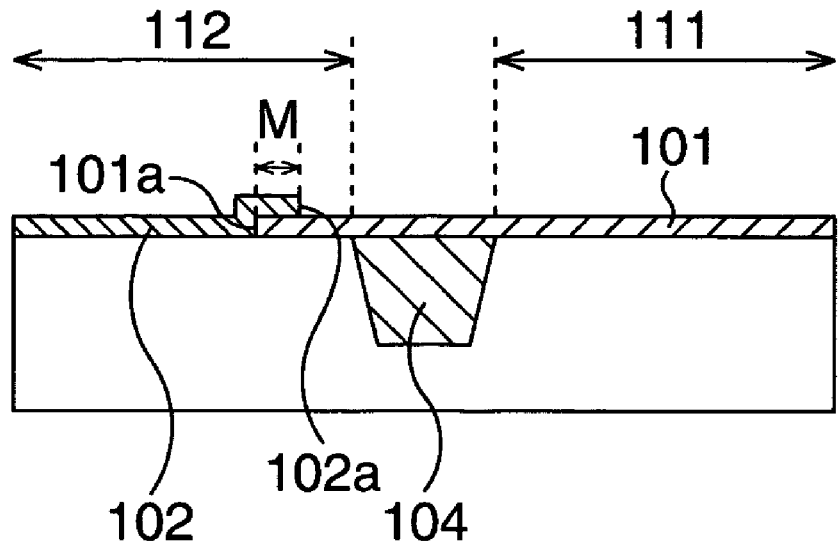
FIG. 2A and FIG. 2B are schematic sectional views for explaining the basic gist of the present invention.
Figure 2B:
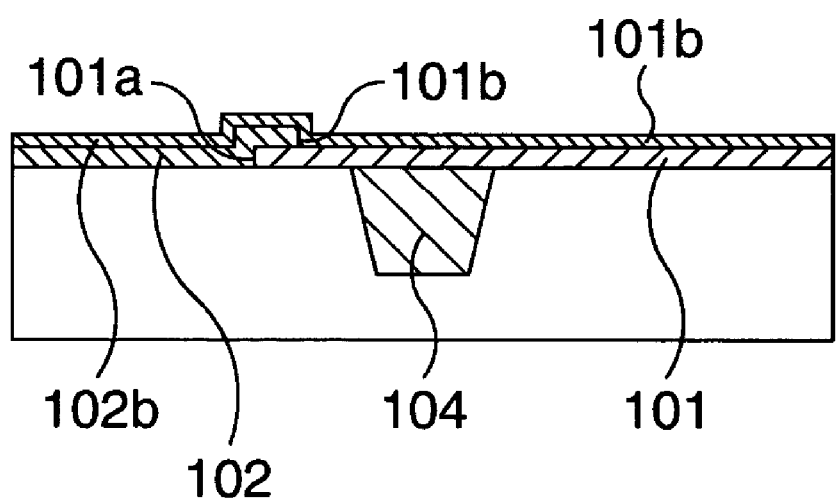

Hence, in the present invention, to prevent the occurrence of the aforementioned situation, as shown in FIG. 2A and FIG. 2B, when the second gate insulating film 102 is patterned, the second gate insulating film 102 is patterned in such a manner that the end portion fabricated 102a of the second gate insulating film 102 partially overlaps the end portion fabricated 101a of the first gate insulating film 101 (FIG. 2A). Here, an overlapping portion is shown as M. Then, the first and second gate insulating films 101 and 102 are subjected to the surface recovery treatment while partially overlapping each other as described above, so that the surface layers 101b and 102b are brought into the nitrided state or the oxynitrided state (FIG. 2B). At this time, no gap is formed between the first and second gate insulating films 101 and 102, whereby even when the overlapping portion of the first gate insulating film 101 and the second gate insulating film 102 is located on the active region (on the second active region 112 in the example shown), the surface recovery of the first and second gate insulating films 101 and 102 becomes possible without the aforementioned degenerated portion being formed even if the surface recovery treatment is performed in this state.

Figure 6:
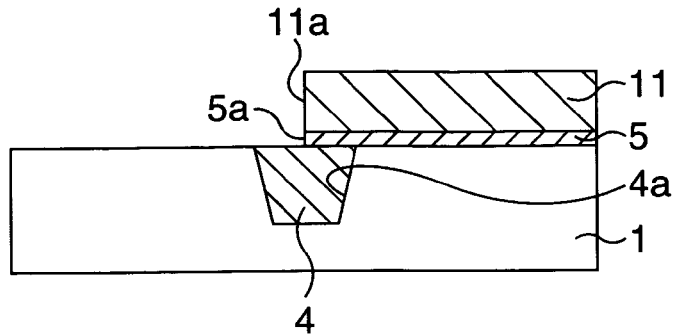
FIG. 6 is a schematic sectional view showing another aspect of the embodiment.

In this respect, Patent Document 1 shows a state in which the first gate insulating film and the second gate insulating film partially overlap each other, for example, in FIG. 6. However, in Patent Document 1, not only a description of the aforementioned treatment of the present invention but also a description which suggests it, even if only slightly, does not exist. Besides, Patent Document 1 specifies only a state in which the overlapping portion of the first gate insulating film and the second gate insulating film is formed on the element isolation structure.

Contrary to this, in the present invention, even if the overlapping portion of the first gate insulating film and the second gate insulating film is located on the active region on the precondition that the aforementioned treatment is performed, the silicide layer or the like can be formed in a desired state without exerting any bad influence on this active region. Accordingly, in the present invention, the overlapping portion may be formed either on the active region or on the element isolation structure. Thereby, design flexibility is increased, which makes higher integration of the device possible.

Specific Embodiment to which the Present Invention is Applied

A specific embodiment to which the present invention is applied will be described below based on the aforementioned basic gist of the present invention.

FIG. 3A to FIG. 5E are schematic sectional views showing a manufacturing method of MIS transistors according to this embodiment step by step. Incidentally, for convenience of explanation, the structures of the MIS transistors are described with the manufacturing method thereof.

Figure 3A:
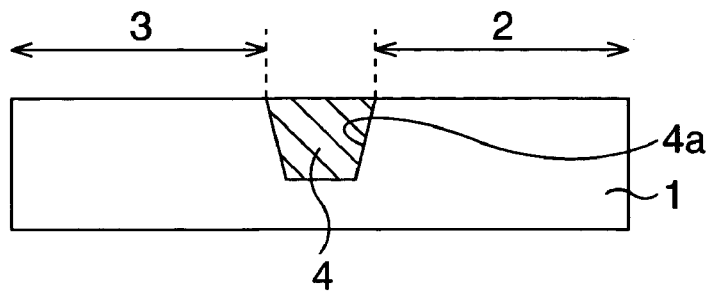
FIG. 3A to FIG. 3F are schematic sectional views showing a manufacturing method of MIS transistors according to an embodiment step by step.

First, as shown in FIG. 3A, a first and second active regions 2 and 3 are demarcated on a silicon substrate 1.

To be precise, an element isolation structure is formed in an element isolation region between a SiO-based transistor and a high dielectric constant transistor on the silicon substrate 1, and the first active region 2 for the SiO-based transistor and the second active region 3 for the high dielectric constant transistor are demarcated. As the element isolation structure, a STI element isolation structure 4 obtained by filling a trench 4a formed in the element isolation region by lithography and dry etching with an insulator such as a silicon oxide is formed by a STI (Shallow Trench Isolation) method. Incidentally, in place of the STI element isolation structure 4, a field oxide film obtained by field-oxidizing the element isolation region by a LOCOS method may be formed.

Figure 3B:
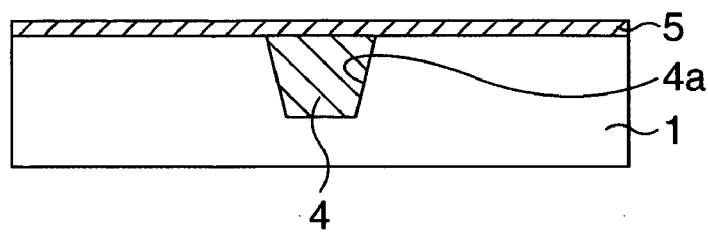

Then, as shown in FIG. 3B, a first gate insulating film 5 is formed on the entire surface, including on the first and second active regions 2 and 3.

To put it in detail, a silicon oxide film (SiO film) is formed to have a thickness of approximately 2 nm on the entire surface, including on the first and second active regions 2 and 3, for example, by a thermal oxidation method. This silicon oxide film becomes a first gate insulating film 5 of a SiO-based transistor. Here, in place of the silicon oxide film, a silicon oxynitride film (SiON film) may be formed, for example, by a CVD method.

Figure 3C:
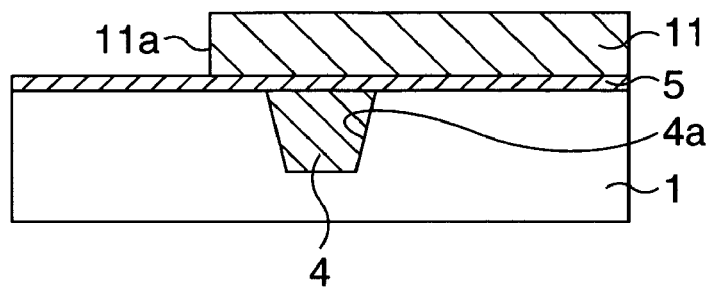

Subsequently, as shown in FIG. 3C, a resist pattern 11 is formed on the first gate insulating film 5.

To put it in detail, first, a resist (not shown) is applied onto an entire surface on the first gate insulating film 5.

Thereafter, the resist is fabricated by lithography to form the resist pattern 11. Here, the resist pattern 11 needs to be formed in such a shape that an end portion fabricated 11a by lithography of the resist pattern 11 is located on any portion other than a first gate electrode forming region in the first active region 2 and a second gate electrode forming region in the second active region 3. Accordingly, the resist pattern 11 can be formed with high design flexibility. In this embodiment, a case where the resist pattern 11 is formed in such a shape as to cover the entire first active region 2 with the end portion fabricated 11a being located on any portion other than the second gate electrode forming region in the second active region 3 is shown as an example.

Figure 3D:
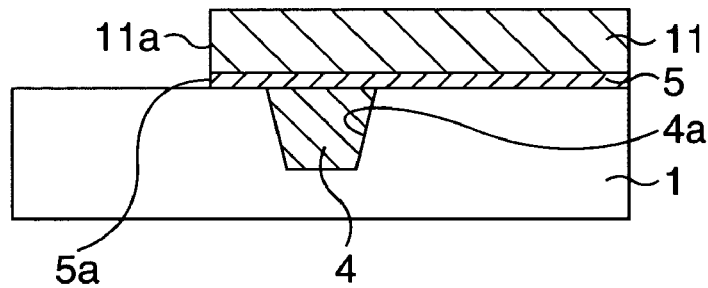

Then, as shown in FIG. 3D, the first gate insulating film 5 is patterned.

To be precise, the first gate insulating film 5 is wet etched with the resist pattern 11 as an etching mask and fabricated in imitation of the shape of the resist pattern 11. By this wet etching, the first gate insulating film 5 is left so as to cover the entire first active region 2 with an end portion fabricated 5a by wet etching of the first gate insulating film 5 being located on the any portion other than the second gate electrode forming region in the second active region 3. Here, a case where as a result of forming and wet etching the resist pattern 11 in such a manner that the end portion fabricated 11a is located on the any portion, the end portion fabricated 5a of the first gate insulating film 5 is located on the second active region 3 is shown as an example.

Figure 3E:
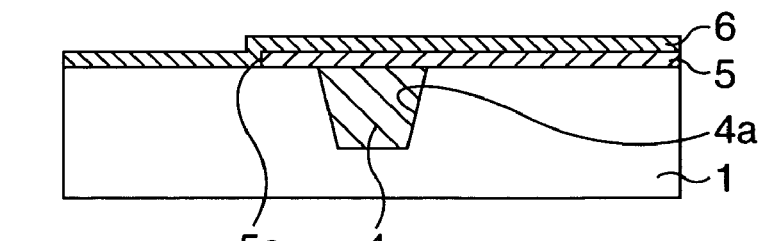

Subsequently, as shown in FIG. 3E, a second gate insulating film 6 is formed on the entire surface, including on the first gate insulating film 5.

More specifically, first, the resist pattern 11 is removed by wet etching or the like.

Thereafter, a high dielectric constant film is formed to have a thickness of approximately 3 nm, for example, by the CVD method. This high dielectric constant film becomes the second gate insulating film 6 of a high dielectric constant transistor. An example of the high dielectric constant film here is an oxide or an oxynitride of one kind or two kinds of metals selected from Hf, Zr, Si, Al, and Ta. Here, for example, a hafnium oxide ($HfO_2$) film is used.

Figure 3F:
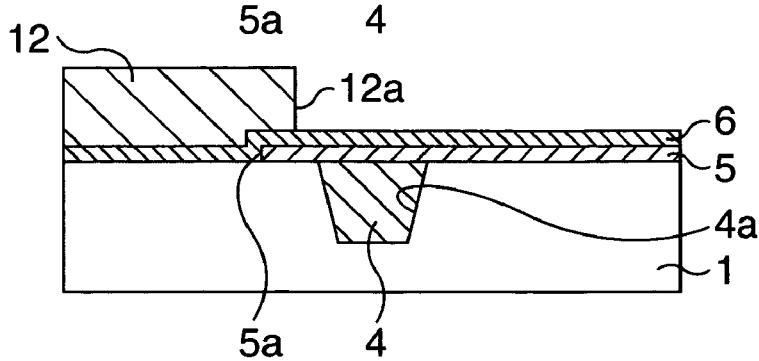

Then, as shown in FIG. 3F, a resist pattern 12 is formed on the second gate insulating film 6.

To put it in detail, first, a resist (not shown) is applied onto an entire surface on the second gate insulating film 6.

Subsequently, the resist is fabricated by lithography to form the resist pattern 12. Here, the resist pattern 12 is formed in such a shape that an end portion fabricated 12a by lithography of the resist pattern 12 overlaps the end portion fabricated 5a of the first gate insulating film 5.

Figure 4A:
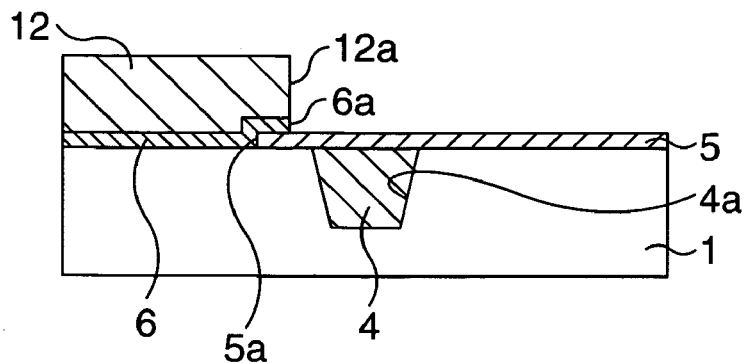
FIG. 4A to FIG. 4E are schematic sectional views subsequent to FIG. 3A to FIG. 3F, showing the manufacturing method of the MIS transistors according to the embodiment step by step.

Thereafter, as shown in FIG. 4A, the second gate insulating film 6 is patterned.

More specifically, the second gate insulating film 6 is patterned using the resist pattern 12 as an etching mask and fabricated in imitation of the shape of the resist pattern 12. By this dry etching, the second gate insulating film 6 is left so that an end portion fabricated 6a by this dry etching overlaps the end portion fabricated 5a of the first gate insulating film 5 on the second active region 3.

Figure 4B:
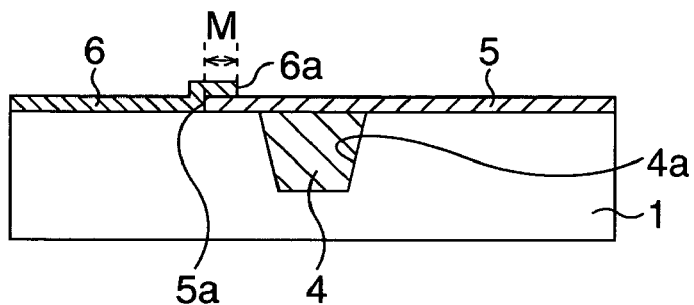

Then, as shown in FIG. 4B, the resist pattern 12 is removed.

To be precise, the resist pattern 12 is removed by wet etching or the like. Here, an overlapping portion of the first and second gate insulating films 5 and 6 is shown as M. In this embodiment, the overlapping portion M is located on the second active region 3. Since the first and second gate insulating films 5 and 6 overlap each other by the overlapping portion M as just described, the entire surfaces of the first and second active regions 2 and 3 are certainly covered with the first and second gate insulating films 5 and 6 without any gap occurring between the first gate insulating film 5 and the second gate insulating film 6.

Here, when the second gate insulating film 6 is dry etched, especially the first gate insulating film 5 suffers surface damage by this dry etching. The second gate insulating film 6 also often suffers surface damage in its forming step.

Figure 4C:
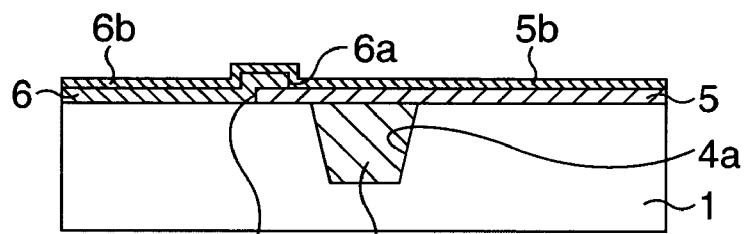

Hence, in this embodiment, in order to recover the surface damage of the first and second gate insulating films 5 and 6, the entire surfaces of the first and second gate insulating films 5 and 6 are subjected to a surface recovery treatment as shown in FIG. 4C.

To put it in detail, as the surface recovery treatment, a nitriding treatment or an oxynitriding treatment is performed. More specifically, in the case of the nitriding treatment, one treatment selected from a treatment by a plasma nitriding method and a treatment by an $NH_3$ annealing method (annealing under an $NH_3$ atmosphere) is suitable. In the case of the oxynitriding treatment, one treatment selected from a series of treatments by the plasma nitriding method and an $O_2$ annealing method (annealing under an oxygen atmosphere), a treatment by an NO annealing method (annealing under an NO atmosphere), and a series of treatments by the $NH_3$ annealing method and the $O_2$ annealing method is suitable.

In this embodiment, the series of treatments by the plasma nitriding method and the $O_2$ annealing method is given as an example. In the plasma nitriding method, an apparatus which excites plasma, for example, using an RF (radio frequency) power supply is used.

By subjecting the entire surfaces of the first and second gate insulating films 5 and 6 to the series of treatments, oxygen and nitrogen are mixed into surface layers 5b and 6b of the first and second gate insulating films 5 and 6, so that the surface layers 5b and 6b are brought into an oxynitrided state with a higher oxygen and nitrogen content than portions other than these surface layers 5b and 6b, and thereby the surface damage of the first and second gate insulating films 5 and 6 is repaired. On this occasion, since the entire surfaces of the first and second active regions 2 and 3 are certainly covered with the first and second gate insulating films 5 and 6, the occurrence of a degenerated portion caused by the aforementioned surface recovery treatment in the first and second active regions 2 and 3 can be certainly prevented.

Incidentally, when the nitriding treatment is performed as the surface recovery treatment, nitrogen is mixed into the surface layers 5b and 6b of the first and second gate insulating films 5 and 6, so that the surface layers 5b and 6b are brought into a nitrided state with a higher nitrogen concentration than portions other than these surface layers 5b and 6b, and thereby the surface damage of the first and second gate insulating films 5 and 6 is repaired.

Figure 4D:
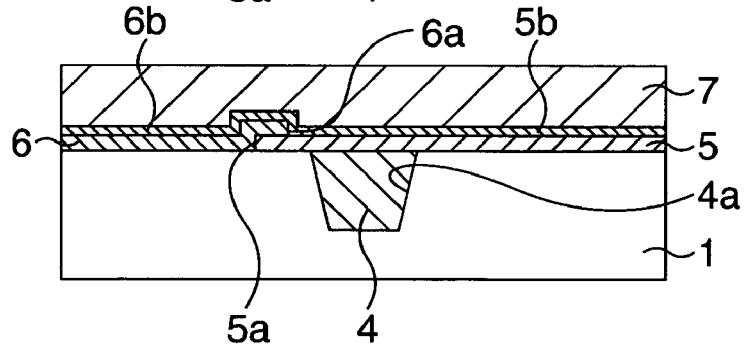

Subsequently, as shown in FIG. 4D, a polycrystalline silicon film 7 which becomes gate electrodes is formed.

To be precise, the polycrystalline silicon film 7 is deposited with a thickness of approximately 100 nm so as to cover the entire surfaces of the first and second gate insulating films 5 and 6, for example, by the CVD method.

Figure 4E:
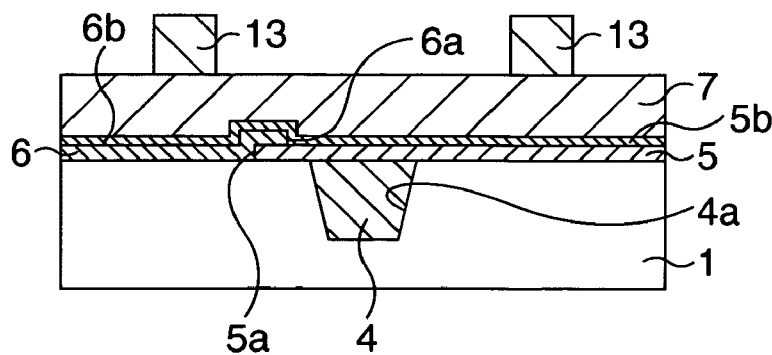

Thereafter, as shown in FIG. 4E, resist patterns 13, each having a gate electrode shape, are formed.

More specifically, first, a resist (not shown) is applied onto an entire surface on the polycrystalline silicon film 7.

Then, the resist is fabricated by lithography to form the resist patterns 13 having the gate electrode shape on the first and second active regions 2 and 3, respectively.

Figure 5A:
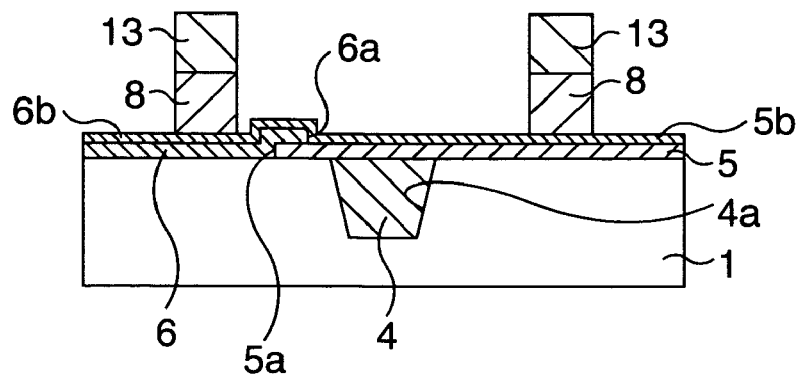
FIG. 5A to FIG. 5E are schematic sectional views subsequent to FIG. 4A to FIG. 4E, showing the manufacturing method of the MIS transistors according to the embodiment step by step.

Subsequently, as shown in FIG. 5A, gate electrodes 8 are pattern-formed.

To put it in detail, the polycrystalline silicon film 7 is dry etched using the resist patterns 13 as etching masks to pattern-form the gate electrodes 8 on the first and second gate insulating films 5 and 6, respectively.

Figure 5B:
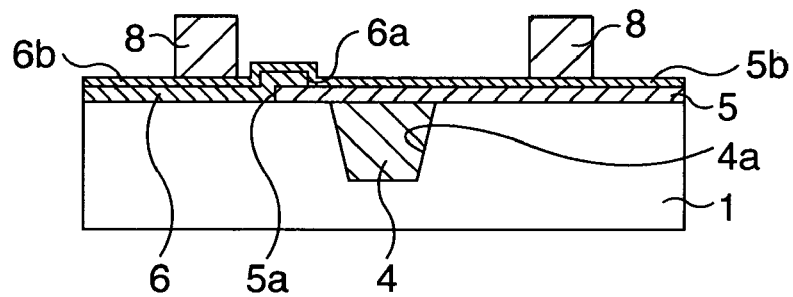

Thereafter, as shown in FIG. 5B, the resist patterns 13 are removed.

To be precise, the resist patterns 13 are removed by ashing or the like. At this time, the gate electrodes 8 composed of the polycrystalline silicon film 7 are left on the first and second gate insulating films 5 and 6, respectively.

Figure 5C:
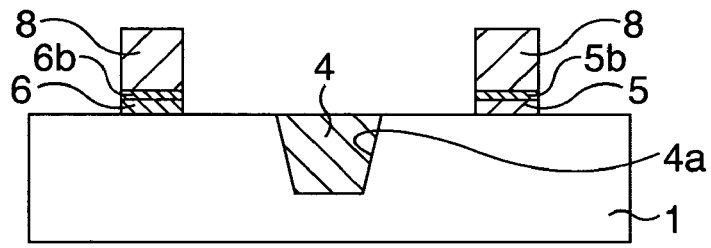

Then, as shown in FIG. 5C, the first and second gate insulating films 5 and 6 are patterned.

More specifically, the first and second gate insulating films 5 and 6 are wet etched using the respective gate electrodes 8 as etching masks. By this wet etching, the first and second gate insulating films 5 and 6 are patterned in imitation of the shapes of the respective gate electrodes 8.

Figure 5D:
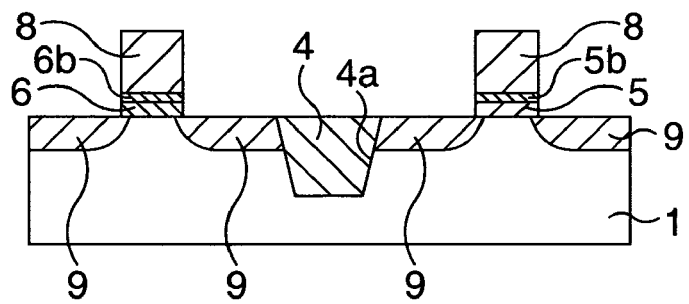

Subsequently, as shown in FIG. 5D, source/drain regions 9 are formed in the first and second active regions 2 and 3, respectively.

To put it in detail, using the respective gate electrodes 8 as masks, an impurity, here phosphorus (P) which is an n-type impurity, is simultaneously ion-implanted into a surface layer of the first active region 2 on both sides of the gate electrode 8 and a surface layer of the second active region 3 on both sides of the gate electrode 8. Ion implantation conditions are a dose amount of $1 \times 10^{16}/cm^2$ and an acceleration energy of 10 keV. Then, by annealing the silicon substrate 1, the implanted impurity is activated. Thus, the source/drain regions 9 are respectively formed on the surface layers of the first and second active regions 2 and 3 on both sides of the respective gate electrodes 8.

On this occasion, on the first active region 2, a SiO-based transistor 21 including the gate electrode 8 which is pattern-formed with the first gate insulating film 5 whose surface layer 5b is brought into the oxynitrided state therebetween and the source/drain regions 9 is formed. On the other hand, on the second active region 3, a high dielectric constant transistor 22 including the gate electrode 8 which is pattern-formed with the second gate insulating film 6 whose surface layer 6b is brought into the oxynitrided state therebetween and the source/drain regions 9 is formed.

Figure 5E:
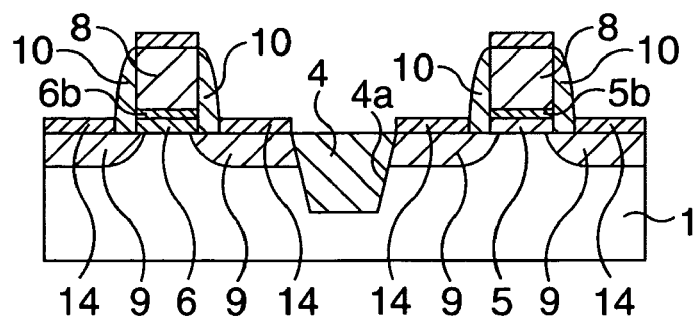

Thereafter, as shown in FIG. 5E, the respective transistors 21 and 22 are salicided.

More specifically, first, an insulating film, here a silicon oxide film (not shown), is deposited on the entire surface, for example, by the CVD method so as to cover the respective transistors 21 and 22. The entire surface of this silicon oxide film is subjected to anisotropic dry etching (etch back), and the silicon oxide film is left only on both side surfaces of the respective gate electrodes 8 and the first and second gate insulating films 5 and 6 to form sidewall spacers 10.

Then, a silicide metal film (not shown), here cobalt (Co), is deposited on the entire surface, for example, by a sputtering method so as to cover the respective transistors 21 and 22. Subsequently, by heat-treating the silicon substrate 1, the silicide metal film reacts with silicon portions, that is, upper surfaces of the respective gate electrodes 8 and upper surfaces of the respective source/drain regions 9 to form a silicide layer 14 on the upper surfaces of the respective gate electrodes 8 and the upper surfaces of the respective source/drain regions 9. Here, the respective gate electrodes 8 and the respective source/drain regions 9 are isolated by the sidewall spacers 10, respectively, whereby a short circuit therebetween due to the silicide layer is prevented. Thereafter, the unreacted silicide metal film (silicide metal film on portions other than on the respective gate electrodes 7 and on the respective source/drain regions 9) is removed by wet etching.

Then, through post processes such as a step of forming an interlayer insulating film and various kinds of wiring layers and so on, the MIS transistors of this embodiment are completed.

As described above, according to this embodiment, when the first gate insulating film 5 and the second gate insulating film 6 are separately formed on the first active region 2 and the second active region 3, respectively, it becomes possible to obtain better transistor characteristics by recovering surface damage due to etching and higher integration of the device by increasing design flexibility.

Incidentally, in this embodiment, when the first gate insulating film 5 is patterned, the first gate insulating film 5 is only required to be patterned in such a manner that the end portion fabricated 5a is located on any portion other than the first and second gate electrode forming regions. From this, for example, in the step in FIG. 3D, as shown in FIG. 6, the first gate insulating film 5 may be patterned, positively or as a result of the aforementioned any portion, in such a manner that the end portion fabricated 5a is located on the STI element isolation structure 4.

MODIFIED EXAMPLE

Now, the modified example of the embodiment will be described.

In this modified example, similarly to the embodiment, a manufacturing method of a MIS transistor is disclosed, but is different in that preliminary surface recovery treatments are performed prior to the aforementioned surface recovery treatment.

Figure 7A:
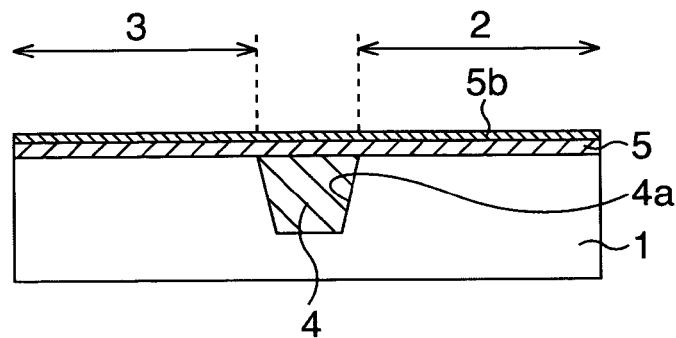
FIG. 7A to FIG. 7C are schematic sectional views showing only main steps of a manufacturing method of MIS transistors according to a modified example of the embodiment.
Figure 7B:
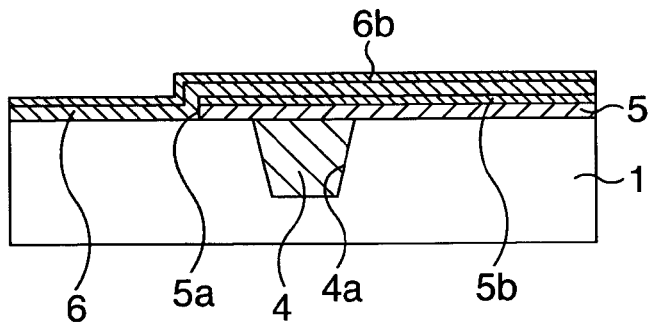
Figure 7C:
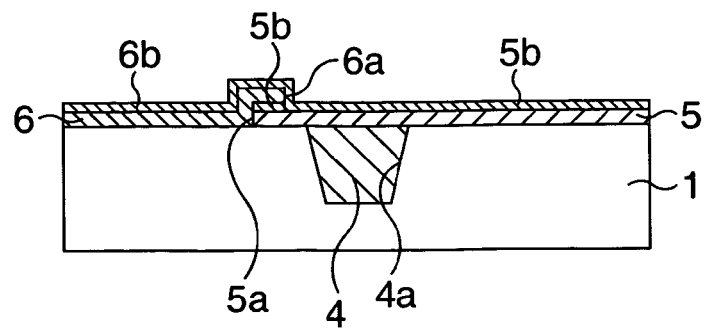

FIG. 7A to FIG. 7C are schematic sectional views showing only main steps of the manufacturing method of the MIS transistors according to this modified example. Incidentally, the same numerals and symbols will be used to designate the same components as those disclosed in the embodiment, so that a detailed description thereof will be omitted.

In this modified example, prior to the surface recovery treatment shown in FIG. 4C, the preliminary surface recovery treatment is individually performed on each of the first and second gate insulating films 5 and 6. Here, as the preliminary surface treatment described later, the nitriding treatment or the oxynitriding treatment is performed similarly to the surface recovery treatment shown in FIG. 4C. More specifically, in the case of the nitriding treatment, one treatment selected from a treatment by a plasma nitriding method and a treatment by an $NH_3$ annealing method (annealing under an $NH_3$ atmosphere) is suitable. In the case of the oxynitriding treatment, one treatment selected from a series of treatments by the plasma nitriding method and an $O_2$ annealing method (annealing under an oxygen atmosphere), a treatment by an NO annealing method (annealing under an NO atmosphere), and a series of treatments by the $NH_3$ annealing method and the $O_2$ annealing method is suitable.

In this modified example, the series of treatments by the plasma nitriding method and the $O_2$ annealing method is given as an example of the preliminary surface recovery treatment. In the plasma nitriding method, for example, an apparatus which excites plasma using an RF (radio frequency) power supply is used.

First, after the respective steps in FIG. 3A and FIG. 3B have been completed, as shown in FIG. 7A, the entire surface of the first gate insulating film 5 is subjected to the aforementioned series of treatments as the preliminary surface recovery treatment. By this series of treatments, the surface layer 5b of the first gate insulating film 5 is brought into the oxynitrided state, and thereby a little surface damage caused when and after the first gate insulating film 5 is formed is repaired.

Then, after the respective steps in FIG. 3C to FIG. 3E have been completed, as shown in FIG. 7B, the entire surface of the second gate insulating film 6 is subjected to the aforementioned series of treatments as the preliminary surface recovery treatment. By this series of treatments, the surface layer 6b of the first gate insulating film 6 is brought into the oxynitrided state, and thereby a little surface damage caused when and after the second gate insulating film 6 is formed is repaired.

Subsequently, after the respective steps in FIG. 3F, FIG. 4A, and FIG. 4B have been completed, similarly to FIG. 4C, the entire surfaces of the first and second gate insulating films 5 and 6 are subjected to the surface recovery treatment, here the aforementioned series of treatments again, as shown in FIG. 7C. By this series of treatments, the surface layers 5b and 6b of the first and second gate insulating films 5 and 6 are brought into the oxynitrided state again, and the surface damage is repaired.

Thereafter, through the respective steps in FIG. 4D, FIG. 4E, and FIG. 5A to FIG. 5E and various post processes, the MIS transistors of this modified example are completed.

As described above, according to this modified example, when the first gate insulating film 5 and the second gate insulating film 6 are separately formed on the first active region 2 and the second active region 3, respectively, it becomes possible to obtain better transistor characteristics by recovering surface damage due to etching and higher integration of the device by increasing design flexibility. Moreover, in this modified example, prior to the simultaneous surface recovery treatment on the first and second gate insulating films 5 and 6, the preliminary surface recovery treatment is individually performed on each of the first and second gate insulating films 5 and 6, which makes it possible to more certainly recover the damage caused to the first and second gate insulating films 5 and 6.

According to the present invention, when the first gate insulating film and the second gate insulating film are separately formed on the first active region and the second active region, respectively, it becomes possible to obtain better transistor characteristics by recovering surface damage due to etching and higher integration of the device by increasing design flexibility.

The present embodiment is to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising the steps of:
    subjecting a surface of a semiconductor substrate to element isolation to demarcate a first active region and a second active region;
    forming a first gate insulating film on the first active region and the second active region;
    fabricating the first gate insulating film and leaving the first gate insulating film in such a manner that an end portion fabricated of the first gate insulating film is located on any portion other than a first gate electrode forming region in the first active region and a second gate electrode forming region in the second active region;
    forming a second gate insulating film on the first active region and the second active region, including on the first gate insulating film;
    fabricating the second gate insulating film and leaving the second gate insulating film in such a manner that an end portion fabricated of the second gate insulating film overlaps the end portion fabricated of the first gate insulating film;
    simultaneously subjecting a surface of the first gate insulating film and a surface of the second gate insulating film to a surface recovery treatment; and
    pattern-forming a first gate electrode on the first gate electrode forming region with the first gate insulating film therebetween and a second gate electrode on the second gate electrode forming region with the second gate insulating film therebetween, respectively.

2. The manufacturing method of the semiconductor device according to claim 1, wherein the surface recovery treatment is a nitriding treatment.

3. The manufacturing method of the semiconductor device according to claim 2, wherein the nitriding treatment is one treatment selected from the group consisting of a treatment by a plasma nitriding method and a treatment by an $NH_3$ annealing method.

4. The manufacturing method of the semiconductor device according to claim 1, wherein the surface recovery treatment is an oxynitriding treatment.

5. The manufacturing method of the semiconductor device according to claim 4, wherein the oxynitriding treatment is one treatment selected from the group consisting of a series of treatments by a plasma nitriding method and an $O_2$ annealing method, a treatment by an NO annealing method, and a series of treatments by an $NH_3$ annealing method and the $O_2$ annealing method.

6. The manufacturing method of the semiconductor device according to claim 1, wherein said step of fabricating the first gate insulating film, the first gate insulating film is fabricated in such a manner that the end portion fabricated of the first gate insulating film is located on the any portion and located on the first active region or on the second active region.

7. The manufacturing method of the semiconductor device according to claim 1, wherein one of the first gate insulating film and the second gate insulating film is a film made of a silicon oxide or a silicon oxynitride and the other is a film made of a high dielectric constant material.

8. The manufacturing method of the semiconductor device according to claim 7, wherein the high dielectric constant film is an oxide or an oxynitride of one kind or two or more kinds of metals selected from the group consisting of Hf, Zr, Si, Al, and Ta.

9. The manufacturing method of the semiconductor device according to claim 1, further comprising the step of subjecting the first active region and the second active region to a salicide treatment.

10. The manufacturing method of the semiconductor device according to claim 1, further comprising the steps of, prior to the surface recovery treatment:

subjecting an entire surface of the first gate insulating film to a preliminary surface recovery treatment after the first gate insulating film is formed and before the first gate insulating film is fabricated; and subjecting an entire surface of the second gate insulating film to a preliminary surface recovery treatment after the second gate insulating film is formed and before the second gate insulating film is fabricated.

11. The manufacturing method of the semiconductor device according to claim 10, wherein each of the preliminary surface recovery treatments is a nitriding treatment.

12. The manufacturing method of the semiconductor device according to claim 11, wherein the nitriding treatment is one treatment selected from the group consisting of a treatment by a plasma nitriding method and a treatment by an $NH_3$ annealing method.

13. The manufacturing method of the semiconductor device according to claim 10, wherein each of the preliminary surface recovery treatments is an oxynitriding treatment.

14. The manufacturing method of the semiconductor device according to claim 13, wherein the oxynitriding treatment is one treatment selected from the group consisting of a series of treatments by a plasma nitriding method and an $O_2$ annealing method, a treatment by an NO annealing method, and a series of treatments by an $NH_3$ annealing method and the $O_2$ annealing method.

* * * * *